United States Patent [19]
Sweatt

[11] Patent Number: 5,805,365
[45] Date of Patent: Sep. 8, 1998

[54] RINGFIELD LITHOGRAPHIC CAMERA

[75] Inventor: William C. Sweatt, Albuquerque, N. Mex.

[73] Assignee: Sandia Corporation, Albuquerque, N. Mex.

[21] Appl. No.: 542,411

[22] Filed: Oct. 12, 1995

[51] Int. Cl.⁶ .................................................. G02B 5/10
[52] U.S. Cl. ............................................ 359/858; 378/34
[58] Field of Search .................................. 359/633, 858, 359/859; 378/34, 35

[56] References Cited

U.S. PATENT DOCUMENTS

| | | | |
|---|---|---|---|
| 3,748,015 | 7/1973 | Offner | 350/55 |
| 4,226,501 | 10/1980 | Shafer | 359/366 |
| 4,240,707 | 12/1980 | Wetherell | 350/294 |
| 4,241,390 | 12/1980 | Markle et al. | 362/299 |
| 4,733,955 | 3/1988 | Cook | 350/620 |
| 4,737,021 | 4/1988 | Korsch | 359/366 |
| 4,747,678 | 5/1988 | Shafer | 350/505 |
| 4,804,258 | 2/1989 | Kebo | 359/366 |
| 5,003,567 | 3/1991 | Hawryluk | 378/34 |
| 5,063,586 | 11/1991 | Jewell et al. | 378/34 |
| 5,153,898 | 10/1992 | Suzuki et al. | 378/34 |
| 5,220,590 | 6/1993 | Bruning | 378/34 |
| 5,222,112 | 6/1993 | Terasawa et al. | 378/34 |
| 5,257,139 | 10/1993 | Higuchi | 378/34 |
| 5,315,629 | 5/1994 | Jewell | 378/34 |
| 5,353,322 | 10/1994 | Bruning | 378/34 |
| 5,361,292 | 11/1994 | Sweatt | 378/34 |
| 5,439,781 | 8/1995 | MacDowell et al. | 378/34 |
| 5,524,039 | 6/1996 | Kamon | 378/34 |

*Primary Examiner*—Georgia Y. Epps
*Assistant Examiner*—Thomas Robbins
*Attorney, Agent, or Firm*—Andrew A. Abeyta; Gregory A. Cone

[57] ABSTRACT

A projection lithography camera is presented with a wide ringfield optimized so as to make efficient use of extreme ultraviolet radiation from a large area radiation source (e.g., $D_{source} \approx 0.5$ mm). The camera comprises four aspheric mirrors optically arranged on a common axis of symmetry with an increased etendue for the camera system. The camera includes an aperture stop that is accessible through a plurality of partial aperture stops to synthesize the theoretical aperture stop. Radiation from a mask is focused to form a reduced image on a wafer, relative to the mask, by reflection from the four aspheric mirrors.

15 Claims, 8 Drawing Sheets

RINGFIELD LITHOGRAPHIC CAMERA

I. GOVERNMENT RIGHTS

This invention was made with United States Government support under Contract No. DE-AC04-94AL85000 awarded by the U.S. Department of Energy. The Government has certain rights in this invention.

II. BACKGROUND OF THE INVENTION

A. Technical Field of the Invention

The present invention relates generally to the field of lithographic cameras used in projection lithography for the fabrication of devices, e.g., integrated circuits, using sub-micron design rules. More specifically, the present invention relates to a novel, scanned ringfield lithography camera with a much larger etendue (a.k.a., Lagrange Optical Invariant or throughput) than previously enjoyed in the art. The larger etendue is accomplished by increasing the ringfield width, W or $\Delta r$, from $\Delta r_{wafer}=1$ mm in the prior art to as much as $\Delta r_{wafer}=7$ mm in the scanning direction. The present invention is intended for use with extreme ultra-violet or soft x-ray radiation with wavelength in the range of $\lambda=50$ to 700 Å ("Angstrom"), typically $\lambda=134$ Å.

B. Discussion of Related Art

In general, lithography refers to processes for pattern transfer between various media. It is a technique used for integrated circuit fabrication in which a silicon slice, the wafer, is coated uniformly with a radiation-sensitive film, the resist, and an exposing source (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image them with radiation of a shorter wavelength. "Long" or "soft" x-rays (a.k.a, Extreme UV), wavelength range of $\lambda=50$ to 700 Å ("Angstrom")) are now at the forefront of research in an effort to achieve the smaller desired feature sizes. EUV radiation, however, has its own problems. The complicated and precise optical lens systems used in conventional projection lithography do not work well for a variety of reasons. Chief among them is the fact that most x-ray reflectors have efficiencies of only about 60%, which in itself dictates very simple beam guiding optics with very few surfaces.

The present state-of-the-art for Very Large Scale Integration ("VLSI") is a 16 megabit microchip with circuitry built to design rules of 0.5 $\mu$m (minimum feature size). Effort directed to further miniaturization takes the initial form of more fully utilizing the resolution capability of presently-used ultraviolet delineating radiation. "Deep UV" (wavelength range of $\lambda=1000$ to 3000 Å), with techniques such as phase masking, off-axis illumination, and step-and-repeat may permit design rules (minimum feature or space dimension) of 0.25 $\mu$m or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths. Two x-ray radiation sources are under consideration: a Laser Plasma Source and a Synchrotron source.

The electron storage ring synchrotron source has been used for many years and is at advanced stage of development. Synchrotrons are particularly promising sources of x-rays for lithography because they provide very stable and defined sources of x-rays. Synchrotrons, however, are far more expensive and much larger than LPSs and seem to experience more "down time." Electrons, accelerated to relativistic velocity, follow their magnetic-field-constrained orbit inside a vacuum enclosure of the synchrotron and emit electromagnetic radiation as they are bent by a magnetic field used to define their path of travel. Radiation, in the wavelength range of consequence for lithography, is reliably produced. The synchrotron produces precisely defined radiation to meet the demands of extremely sophisticated experimentation but is a large, very costly piece of apparatus. Economics seem to dictate that a synchrotron source must provide radiation for at least eight camera systems.

The laser plasma source ("LPS") is less costly than the synchrotron source. The LPS is compact and may be dedicated to a single camera system (so that malfunction or maintenance does not impede the operation of a large fraction of a production facility). The LPS depends upon a high-power, pulsed laser (e.g., a yttrium aluminum garnet ("YAG") laser), or an excimer laser, delivering 500 to 1,000 watts of power in a few microseconds pulse to a 50 $\mu$m to 250 $\mu$m spot, thereby heating a source material to, for example, 250,000° C., to emit EUV (or x-ray) radiation from the resulting plasma. The plasma is produced by a high-power, pulsed laser that is focused on a metal surface (e.g., Au, Sn, W) or in a gas jet (e.g., Ze or $H_2O$) (See Kubiak et al., Cluster Beam Targets for Laser Plasma Extreme Ultraviolet and Soft X-ray Sources, U.S. patent application Ser. No. 08/378,426, U.S. Pat. No. 5,577,092.). When the plasma is formed on a metal surface, the plasma melts and shocks the metal, producing high-velocity ejecta debris, a disadvantage which must be overcome for a commercial tool, that can damage or coat the collecting mirror. Some new debris mitigation schemes appear to be quite promising. For example, a plasma formed in a gas jet produces very little debris, but is significantly larger and is less intense. Such a source is disclosed in Kubiak et al., Cluster Beam Targets for Laser Plasma Extreme Ultraviolet and Soft X-ray Sources, U.S. patent application Ser. No. 08/378,426, and the wide ringfield of the present invention is designed to take advantage of the large source.

Additionally, a variety of x-ray patterning approaches have been considered. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing or distance from the wafer (i.e., out of contact with the wafer, thus, the term "proximity"), which lessens the likelihood of mask damage but does not eliminate it. Making perfect masks on a fragile membrane continues to be a major problem. The necessary absence of optics in-between the mask and the wafer necessitates a high level of parallelicity in the incident radiation. X-ray radiation of wavelength $\lambda \leq 16$ Å is required for 0.25 $\mu$m or smaller patterning to limit diffraction at feature edges on the mask.

Projection lithography has natural advantages over proximity printing. One advantage is that the likelihood of mask damage is greatly reduced, which reduces the cost of the now larger-feature mask. Imaging or camera optics in-between the mask and the wafer compensate for edge scattering or diffraction and, so, permit use of longer wavelength radiation. Use of EUV radiation (a.k.a., soft x-rays) increases the permitted angle of incidence for glancing-angle optics. The resulting system is known as extreme ultra-violet lithography ("EUVL") (a.k.a, soft x-ray projection lithography ("SXPL")).

Mass production of large microchips with feature sizes as small as 100 nm is contemplated with the use of EUVL radiation, e.g., at $\lambda=14$ nm. From an optics perspective, EUVL systems are composed of a condenser (or illuminator) for illuminating a reflective mask and a scanning ringfield camera for imaging the mask onto a wafer with an object:image size reduction of, for example, 5:1. A favored form of EUVL is ringfield scanning. All ringfield optical forms are based on radial dependence of aberration and use the technique of balancing low order aberrations, e.g., third order aberrations, with higher order aberrations at a given radius to create long, narrow illumination fields or annular regions of correction away from the optical axis of the system (regions of constant radius, rotationally symmetric with respect to the axis). Consequently, the shape of the corrected region is an arcuate or curved strip rather than a straight strip. (In practice, the ringfield is defined by a physical structure in the object space of the camera.)

The arcuate strip is a segment of the circular ring with its center of revolution at the optical axis of the camera. See FIG. 4 of U.S. Pat. No. 5,315,629 for an exemplary schematic representation of an arcuate slit defined by width, W, and chord length, L, and depicted as a portion of a ringfield defined by radial dimension, R, spanning the distance from an optic axis and the center of the arcuate slit. The strip width is a function of the smallest feature to be printed with increasing residual aberrations and/or scan distortion at distances greater or smaller than the center radius being of greater consequence for greater resolution. Use of such an arcuate field reduces radially-dependent image aberrations in the image to an acceptable level. Also, use of object:image size reduction of, for example, 5:1 reduction, results in significant cost reduction of the now enlarged-feature mask.

Ringfield cameras have been developed that use only a few surfaces and can image with acuity, i.e., sharpness of sense perception, only along a narrow arc or ringfield. These cameras then use the ringfield to scan a reflective mask and translate the image onto a wafer for processing. Ringfield cameras can be designed to be aberration-free at a given radius, e.g., R=25 mm±~1 mm. A 60° arc or ringfield at this radius can provide a 25 mm chord length. Large microchips (e.g., 25 mm square) can be printed with such a camera if the mask and wafer are scanned perpendicular to such a chord. Examples of cameras designed for ringfield scanning, in addition to the present invention, are included in Jewell et al., U.S. Pat. No. 5,315,629; Bruning et al., U.S. Pat. No. 5,353,322 and 5,220,590; and Offner, U.S. Pat. No. 3,748,015.

A relevant apparatus based on this principle, but for use at longer wavelengths, is the Offner 1:1 ringfield system, U.S. Pat. No. 3,748,015, which is a two-mirror, three-bounce, lithographic camera that has unit magnification. It is a zero distortion, telecentric system used at unit magnification, 1:1. Because of the symmetry of Offner's system (Here, reference is made to the fact that the optical system and beam paths are effectively identical from the object, or mask, to the stop as they are from the stop to the image, or wafer. The "stop" refers to the point of crossover of principal (or chief) rays, or the position in the system at which the aperture is generally placed.), coma and distortion are intrinsically corrected. Balancing of low and high order astigmatism provides a narrow circular region of correction. (Terminology with reference to the various forms of aberrations, e.g., coma, astigmatism, and distortion, is in accordance with conventional usage.) A significant advantage of the Offner 1:1 optical system is that the ringfield correction is achieved with spherical mirrors. Disadvantages of this system include no object:image size reduction and flux throughput is limited by the small ring width corresponding with the narrowness of the corrected zone. Also, Offner's ringfield width is fairly narrow so it relatively inefficient when used with a large area radiation source, such as a debris-less laser plasma source.

Despite the inherent advantages of the 1:1 ringfield approach as used in the scanning mode, there is little confidence that it will play a valuable role in LSI or VLSI fabrication. Aside from the 1:1 mask fabrication problem, the general belief is that throughput of such a scanning system is inherently small due to extreme demands placed on minimization of aberrations across the width of the ringfield. Consequent narrow ring-shape slit results in very low flux throughput.

As noted above, a primary motivation toward EUV projection lithography is the difficulty in 1:1 mask fabrication as required both in proximity printing and in the Offner ringfield system. Wetherell et al., U.S. Pat. No. 4,240,707, and Cook, U.S. Pat. No. 4,733,955, describe optical systems using all-reflective three element objectives. Both these designs are based on configurations that comprise a concave, a negative radius of curvature by definition, mirror interposed between two convex, a positive radius of curvature by definition, ones, and both are designed for the visible/IR part of the spectrum. These systems are well suited for imaging distant objects (at infinity) over either two-dimensional or high-aspect ratio (straight slits) fields of view. Neither of these systems, however, is telecentric in the image space nor corrected for image distortion. Another disadvantage of three-mirror designs for the purpose at hand is that both object and image are located on the same side of the system. The result is severe restriction in wafer motion to avoid obstruction of the optical system.

Bruning et al., U.S. Pat. Nos. 5,220,590 and 5,353,322, also describe a three-mirror camera (alternatively, three aspherics plus a flat mirror) for EUVL. A disadvantage of such three element cameras is inherent in an odd number of mirrors; the object and image are on the same side of the camera and will obstruct each other's path. The present invention overcomes this disadvantage with a fourth mirror to separate the mask and wafer stages. The camera of the present invention has four aspheric mirrors. The parameters, such as curvatures, spacings, relative image heights, etc., of the present invention are different from those of Bruning et al. in a non-scaleable way. The fourth aspheric mirror of the present invention adds more degrees of freedom and more design flexibility. With these extra variables, the present invention is optimized to have very good image quality and negligible distortion over a very wide ringfield, e.g., $\Delta r_{wafer}$=7 mm. As a result, a large fraction of the light from a moderately large laser plasma source ($D_{source} \approx 0.5$ mm) can be used.

Jewell et al., U.S. Pat. No. 5,315,629, describe a four-mirror scanned ringfield camera. It has very good image quality and negligible distortion. However, it has a narrow ringfield width so it is very inefficient in its use of light from a large (300 to 500 micron diameter) laser plasma source. The ringfield width of this design is 0.5 mm which is about 10 times less efficient than the camera design of the present invention. Their efficiency is limited by use of their tertiary mirror, M3, as a hard stop. The design of the present invention gains extra latitude by using a partial stop and a series of apertures (as discussed infra), which allows the imagery to change slightly across the scan. The imagery changes are not a desirable result, but is a satisfactory compromise considering the greater efficiency experienced by the present invention.

Hawryluk et al., U.S. Pat. No. 5,003,567, describe an approach to soft x-ray projection lithography ("SXPL"), which also takes advantage of recent advances in the field of EUV optics. For example, it is possible to build an EUV reduction camera using curved imaging mirrors, which may be spherical or aspheric. Each mirror includes a substrate of a material such as glass-ceramic or sintered glass having a low coefficient of thermal expansion. The first surface of the substrate is typically ground to high precision and polished, which is then overcoated with a multi-layer coating. The alternating (e.g., paired) materials have a large difference in complex index of refraction at the EUV wavelength being used. As a consequence of the periodic variation of complex refractive index, the mirror exhibits high EUV radiation reflectivity at certain angles of incidence. A typical EUV reduction camera uses a reflective mask consisting of a thin, IC metallization pattern overlying an EUV-reflective, multi-layer coating on a polished (flat or curved) substrate surface. The mask is positioned such that EUV radiation incident thereupon are reflected from the mask onto a primary mirror, then onto one or more secondary mirrors, and from the last secondary mirror onto a wafer surface. Image reductions as great as 20:1 have been achieved in this way. A disadvantage of the Hawryluk et al. design, however, is that it requires a curved, pre-distorted object mask, which is undesirable in projection lithography and requires the optics to be adapted accordingly.

Shafer et al., U.S. Pat. No. 4,747,678, describe a 4:1 reduction optical system for deep UV lithography. The optical system uses a combination of a four-mirror reflective system and three groups of refractive lens systems. This is a ringfield system; it is telecentric and has low distortion. The fundamental concept in this design is that the refractive lenses allow for use of spherical mirrors in reduction configuration. This system achieves 0.5 $\mu$m resolution at 2500 Å wavelength, but is not suitable for the EUV or soft x-ray wavelength range due to total absorption by the refractive lenses.

In a reduction form of a ringfield system, coma and distortion are no longer canceled by the symmetry of the configuration. As a result, more design variables are required for the control of these aberrations in addition to spherical aberration, astigmatism, and field curvature. In the design described in Shafer et al., U.S. Pat. No. 4,747,678, the variables take form of additional refractive lenses. For the EUV designs, the additional variables are in the form of aspheric departures of each mirror from a sphere. Aspheric coefficients for third order aberration correction (often called conic constants) and for higher order correction are very effective means for controlling aberrations and, generally, each coefficient can control or correct one order of one aberration term. The use of aspheric mirrors is currently thought to be inevitable for projection EUV systems. All-spherical mirror designs, promising from the standpoint of aberration correction, have been developed, but these systems involve up to ten mirrors. Poor reflectivities of soft x-rays at near-normal incidence—approximately equal to 60% for available multi-layer mirrors—are well below the reflectivity of optical/UV wavelengths (typically 98% and higher) and this imposes a severe restriction on a number of mirrors that can be used in the projection system.

Other difficulties are perhaps of still greater consequence. The 10 to 15 Å wavelength x-ray radiation used in proximity printing is outside the range of presently available x-ray optical coatings as discussed above. This has led to consideration of longer wavelength radiation—in the range centering about 130 Å, e.g., in the range of 100 to 150 Å. While suitable materials for multi-layer coatings of somewhat larger refractive index values at such longer wavelengths are available, limitation on throughput based on slit width, W, continues to be a problem.

Available refractive indices at wavelengths approximately equal to 100 Å, while still quite close to one, are sufficient to permit fabrication of multi-layered reflective optics or Distributed Bragg Reflectors ("DBR"). DBR reflective optics resulting in approximately equal to 60–65% reflectance for use with 140 Å radiation have been constructed and used to obtain 0.1 $\mu$m feature sizes. This approach, providing for full-feature (non-scanning), reduction projection is severely limited by field curvature. While needed resolution is obtainable, field size is very small, e.g., 25×50 $\mu$m with a feature size of 0.1 $\mu$m. While adaptable for use in ringfield scanning, the same field limit applies to result in a slit width W, of the order of a few microns (corresponding with a slit length, L, of the desired several millimeters).

In short, the lure of ringfield projection printing, e.g., for 0.25 $\mu$m and below due to considerations such as mask safety and possibility of object:image reduction, has not yielded to feasible processing. Very high camera/source costs, due to throughput limitations, are considered responsible.

It is expected that effort toward adaptation of x-ray sources for EUVL, such as the new ultra-low debris LPS, will continue. As such, the present invention discloses a lithographic camera system for EUV radiation that can be used with the condensers disclosed and claimed by Sweatt, inventor of the present invention, U.S. Pat. No. 5,361,292, and U.S. patent application Ser. No. 08/469,590, now U.S. Pat. No. 5,512,759, which are two independent condensers designed for a LPS and a synchrotron source, respectively.

The present invention teaches several embodiments for printing microchips with, for example, 130 nm features, which is about twice as small as any now in production. The present invention offers a wider ringfield and, thus, a larger etendue than previously enjoyed in the art.

III. SUMMARY OF THE INVENTION

The principal object of the present invention is to allow greater condenser efficiency and more uniform illumination of the ringfield of the camera.

It is also an object of the present invention to provide a lithographic camera with a wide ringfield (at the wafer) in the range of 1.5 mm $\leq \Delta r_{wafer} \leq$ 8 mm using a large area radiation source of 0.1 mm diameter or larger, typically 0.3 mm to 0.5 mm.

It is still another object to resolve image features of less than 130 nm using illuminated wavelengths in the range of 50 to 700 Å.

It is a further object of the present invention to ensure that the camera has an increased etendue (a.k.a., Lagrange Optical Invariant or throughput).

Additional objects, advantages, and novel features will become apparent to those of ordinary skill in the art, in part, upon examination of the following detailed description of the invention or may be learned by practice of the present invention. The objects, advantages, and novel features of the present invention may be realized and attained by means of the instrumentalities and combinations particularly pointed out in the appended claims.

Accordingly, the present invention accomplishes the foregoing objects by providing a scanned ringfield camera with a ringfield width of at least 2 mm and comprised of a synthesized aperture stop and four aspheric or spherical mirrors arranged on a common optical axis of symmetry, the first aspheric mirror being disposed to receive radiation from a mask and reflect the radiation to the second mirror, the second aspheric mirror being disposed to receive radiation from the first mirror and reflect the radiation to the third mirror, the third aspheric mirror being disposed to receive radiation from the second mirror and reflect the radiation to the fourth mirror, and the fourth aspheric mirror being disposed to receive radiation from the third mirror and focus it at a reduced image area on the wafer. The present invention is a scanned ringfield lithography camera with a much larger etendue (a.k.a., Lagrange Optical Invariant or throughput) than previously enjoyed in the art. The wider ringfield of the present invention allows a greater percentage of the extreme ultraviolet ("EUV") photons from a "broad" source, such as a laser plasma source ("LPS"), to be used by the lithography camera. The larger etendue is accomplished by increasing the ringfield width, W or $\Delta r$, from $\Delta r_{wafer}$=1 mm in the prior art to as much as $\Delta r_{wafer}$=7 mm. Previous cameras have had ringfield widths of $\Delta r_{wafer} \leq 1$ mm, resulting in a small etendue. The wider ringfield of the present invention allows greater condenser efficiency and more uniform illumination of the camera.

Several lithographic camera designs are described herein that allow very small features to be printed on very large microchips. The microchip size is exemplarily 25×25 mm, and the minimum feature size has a critical dimension of C.D.=0.10 mm. These are scanned, ringfield cameras that are designed to provide very good image quality using an EUV wavelength, typically λ=14 nm. The image space of the camera is telecentric, and the chief ray angle is large enough in object space that a reflective mask can be used. The cameras are also designed to have a large etendue so they can be efficiently illuminated with a radiation source, such as a LPS or synchrotron source. The wide ringfield, which produces a large etendue, is a focus of the present invention.

The present invention is capable of resolving image feature sizes of ≦100 nm. In a preferred embodiment, the present invention is a 5:1 ringfield camera that has a numerical aperture of n.a.=0.085 mm with a ringfield width of $\Delta r_{wafer}$=7 mm for printing feature sizes of ≦125 nm. The object:image size may be different for given values of mirror radii and distances between the surfaces and will vary accordingly. In an alternate preferred embodiment, the present invention is a 5:1 ringfield camera that has a numerical aperture of n.a.=0.1 mm with a ringfield width in the range of 2 mm≦$\Delta r_{wafer}$≦2.6 mm for printing feature sizes of ≦100 nm. Prior art cameras have a more narrow ringfield, such as $\Delta r \leq 1$ mm (e.g., Jewell et al. present n.a.=0.1 mm with $\Delta r_{wafer}$=0.5 mm). Thus, the etendue of the present invention is about five times larger than previous systems, which allows at least five times more radiation to be collected from a large area radiation source and directed through the optics to a wafer, i.e., about five times more efficient.

Utilization of reflective optics facilitates operation within the x-ray spectrum—in particular, at "long" x-ray wavelengths at and below 300 Å down to tens of Å. A variety of design features are of particular consequence. Throughput capability in such fabrication results from lens design permitting substantial width as well as substantial straight line length of the scanning ringfield slit—factors resulting also in the ability to pattern delineate otherwise desired large-dimensioned Large Scale Integration ("LSI") microchips within a single scan sequence. Fabrication of Very Large Scale Integrated devices—electronic as well as optical and hybrid—built to design rules of 0.25 μm and below, e.g., 130 nm, is contemplated.

Further scope of applicability of the present invention will become apparent from the detailed description of the invention provided hereinafter. It should be understood, however, that the detailed description of the invention and the specific examples presented, while indicating preferred embodiments of the present invention, are provided for illustration purposes only because various changes and modifications within the spirit and scope of the present invention will become apparent to those of ordinary skill in the art from the detailed description of the invention that follows.

IV. BRIEF DESCRIPTION OF THE DRAWINGS

The accompanying figures, which are incorporated in and form part of the specification, further illustrate the present invention and, together with the detailed description of the invention, serve to explain the principles of the present invention.

Figure 8A:
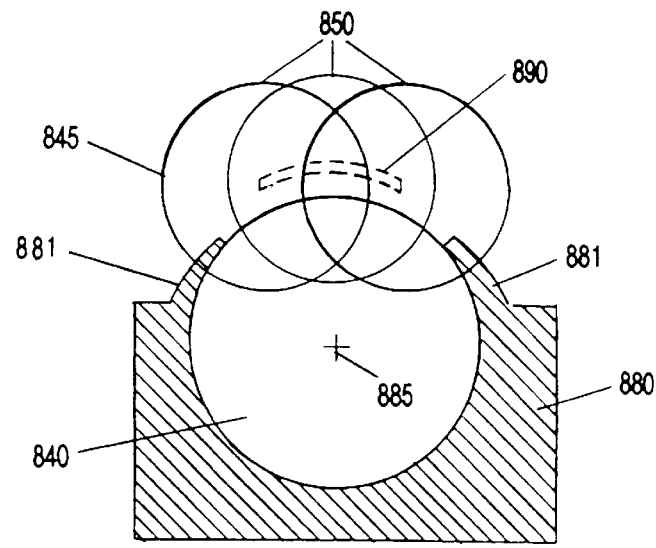
Figure 8B:
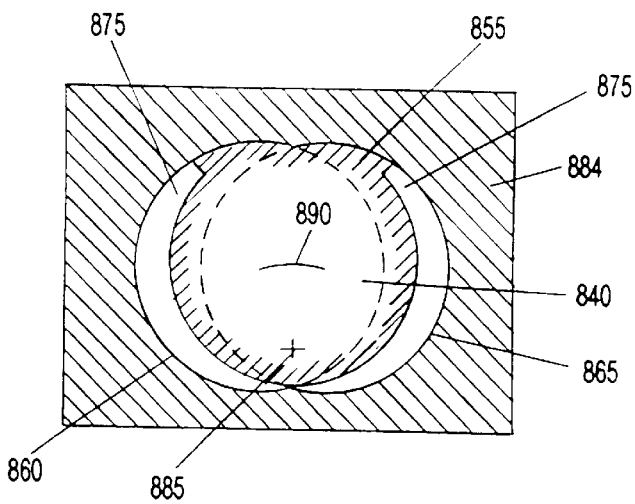
Figure 8C:
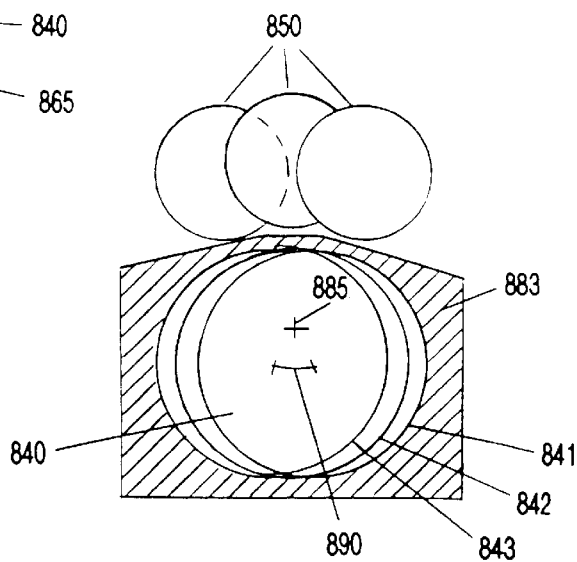

FIG. 8a–c illustrate the cross-sections of the prime aperture stop and the two partial aperture stops (corresponding to FIG. 3) at various positions in the lens system.

Figure 9:
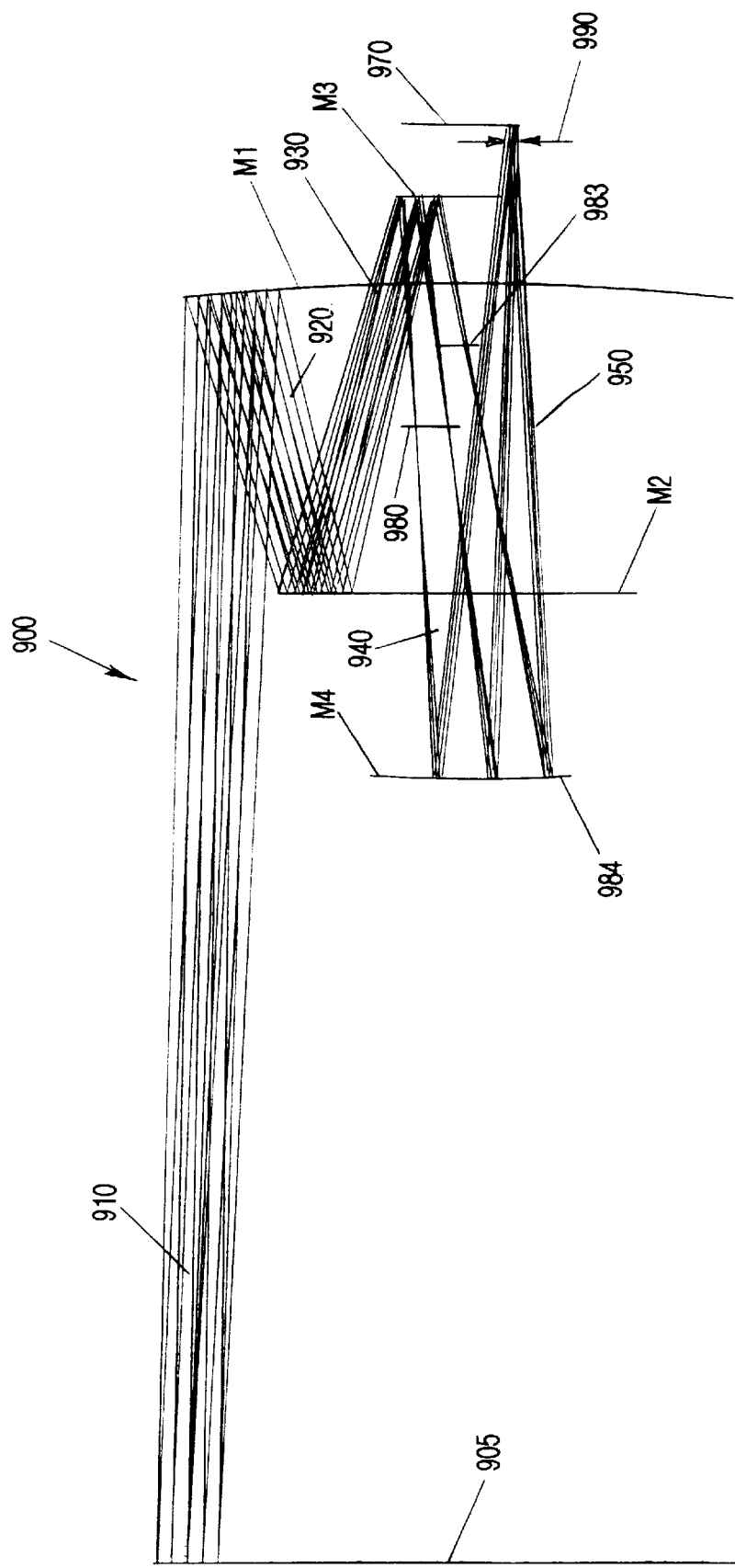

FIG. 9 is a schematic diagram of an EUV projection lithography camera using a lens system with a ringfield of $\Delta r_{wafer} \leq 7$ mm and a numerical aperture of n.a.=0.085 mm for printing feature sizes of $\leq 125$ nm, in accordance with the present invention.

V. DETAILED DESCRIPTION OF THE INVENTION

The following terms of art are defined before providing a description and discussion of the present invention.

A. Terms of Art

Laser Plasma Source: An EUV radiation source for thermally-producing plasma—generally pumped by a high-power pulsed laser.

Illumination Radiation: The delineating radiation as incident on and producing an Illumination Field on a mask (or object), characterized by intensity, direction, divergence, and spectral width.

Synchrotron Source: An EUV radiation source for accelerating electrons or protons in closed orbits in which the frequency of the accelerating voltage is varied (or held constant in the case of electrons) and the strength of the magnetic field is varied so as to keep the orbit radius constant.

Synchrotron Radiation: The delineating electromagnetic radiation generated by the acceleration of charged relativistic particles, usually electrons, in a magnetic field as incident on and producing an illumination field on a mask. The illumination field is characterized by its intensity, direction, divergence, and spectral width.

EUV Radiation: Extreme Ultra-Violet Radiation, also known as long or soft x-rays, with wavelength in the range of 50 to 700 Å.

Full-field Exposure: Simultaneous (rather than sequential) exposure of all subareas of an image field. In its derivation, the term refers generally to a complete circuit pattern such as that of an entire microchip. In this description, it is used to refer to any low-aspect ratio rectilinear pattern region, whether of an entire or partial pattern. Contemplated partial patterns may be stitched together by step-and-repeat to constitute the entire pattern.

Etendue (Lagrange Optical Invariant): In the r-z plane, $E=Y_{bar}U$, where E is the etendue, $Y_{bar}$ is the width of the ringfield at the wafer, and the convergence angle U of the ray bundle is equal to the numerical aperture of the camera, U=n.a. Alternatively, the etendue is the product of the collection solid angle, $d\Omega=2\pi sr$, and the radiation source size, dA. The concept of etendue is derived from the principle of conservation of energy. In a loss-less optical system, the product of flux $$\left(\frac{\overline{\omega}}{cm^2}\right)$$

and beam cross-section ($cm^2$) will remain constant along the optical path. The flux is a linear function of the beam divergence solid angle, $d=2\pi sr$, so $Power \propto A\Omega \propto Y_{bar}^2 U^2$. Therefore, if the Power is constant, then YU is invariant.

Strehl Ratio: The ratio of the peak field intensity in the focus of an optical system to the perfect or diffraction-limited intensity, expressed mathematically as:

$$1-\left(\frac{2\pi\omega_{rms}}{\lambda}\right)^2,$$

where $\omega_{rms}$ is the root-mean-square wavefront error of the system measured from a reference sphere. The Strehl ratio is a measure of the image quality for incoherently illuminated optical systems.

Condenser: Optical system for collecting the EUV source radiation, forming it to be useable by a lithographic camera, for processing the radiation to produce a ringfield illumination field, and for illuminating the mask.

Imaging Optics (or Camera Optics): The optics following the condenser responsible for delivering mask-modulated radiation to the wafer, i.e., the camera optics.

1x Camera: A camera of the class disclosed in U.S. Pat. No. 3,748,015.

5x Camera: A camera of the class disclosed herein and in U.S. Pat. No. 5,315,629.

Lens: The term is used in this description to define any optical element or system of elements that causes EUV radiation to converge or diverge. "Lenses," in x-ray systems, are generally reflecting and are sometimes referred to as "mirrors." Contemplated lenses may be continuous curvature, e.g., of ellipsoidal or other curvature. The convergence or divergence is a result of action analogous to that of a transmission optical lens. All of the optics of the present invention discussed herein are multi-layer mirrors, typically, aspherical.

Aspheric: A mirror surface that is altered slightly from a spherical surface in order to reduce aberrations. The radius of an aspheric mirror is measured the center of curvature of the parent mirror from which the aspheric mirror is cut to the on-axis point of intersection.

Divergence: As used by itself, the term refers to mask divergence, i.e., the largest angle about the axis of the cone of radiation as incident on a mask. In projection lithography, the axis is generally a few degrees off normal incidence as required for reflection masking. The magnitude of divergence required in projection lithography is that needed to reduce ringing at feature edges to the extent necessary for desired resolution and contrast. In full-field exposure mode, divergence should be similar at every illumination point. In scanning mode, some non-uniformity in the scanning direction may be averaged out.

Convergence: As used by itself, the term refers to mask convergence, i.e., the smallest angle about the axis of the cone of radiation as incident on a mask.

Aperture: The diameter of a lens in the camera, usually expressed in millimeters.

Aperture Stop: A limiting opening in the camera that regulates or determines the size of the bundle of rays that traverse the system from a given point of the object to the corresponding point of the image; the aperture stop is located at the point at which the principal or chief rays cross. The aperture stop serves to fold the ray bundles, i.e., to translate the image to the other side of the optics. Also, the aperture stop is an element in an optical system that delineates the portion of the object field actually imaged.

Camera Pupil: Real or virtual aperture that defines the position through which radiation must enter the camera, of angular size defining the diffraction limit of the camera. Its physical size is that of an image of the real limiting aperture of the camera.

Image Space: A region containing the rays before they enter the lens or optical system.

Object Space: A region containing the rays after they have passed through the lens or optical system.

B. Introduction

In order to provide a better understanding of the specific features and advantages of the present invention, it is believed that a brief review of the art would be advantageous. The present invention makes effective use of a large area radiation source of 0.1 mm or larger, exemplarily a synchrotron or a laser plasma source. Pattern delineation to which the radiation is to be applied may take a variety of forms. It may take the form of full-field exposure or of a scanning, e.g., ringfield, region. Exposure may be by proximity printing or by projection lithography. A favored form of projection lithography, known as ringfield projection lithography, makes use of a scanning region of an arcuate shape, likely with object:image size reduction, perhaps by a ratio of 5:1, to permit use of more economical, larger-feature masks as compared to the smaller-feature wafers.

The specific description that follows emphasizes ringfield projection lithography. Where full-field exposure, either proximity printing or projection lithography, requires different optics, notation is made in the final discussion in each section. In projection lithography, a wavelength range of $\lambda=100$ to 140 Å takes advantage of most efficient reflectivity of both the lenses and the mask. In proximity printing, a shorter wavelength in the range of $\lambda=8$ to 16 Å is required for resolution and meets characteristics of available resists.

Figure 1:
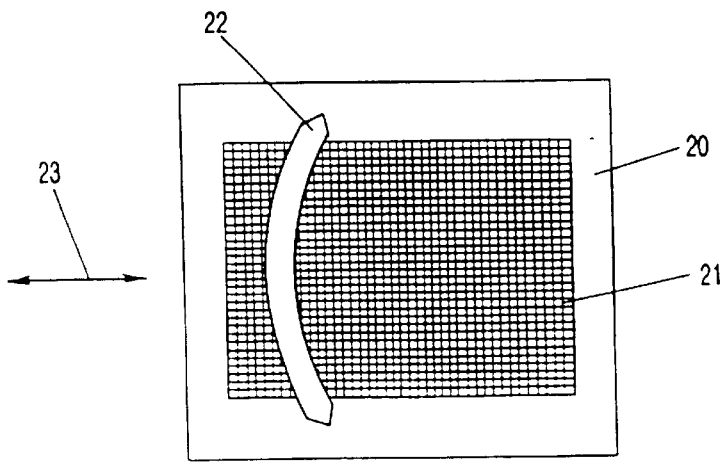
FIG. 1 is a top view of a projection mask being scanned by the arc-shaped illumination field of a ringfield camera.

The general case of ringfield projection lithography is represented by FIG. 1. In FIG. 1, the resistive mask 20 includes a rectilinear patterned region 21, which is being scanned horizontally in direction 23 by an arc-shaped illumination region 22 which may be 1 to 8 mm wide by about 130 mm long. The radiation supplied by the condenser must illuminate only region 22 and no other part of region 21. In full-field exposure (as distinguished from the scanning shown), pattern region 22 and region 21 must be simultaneously illuminated.

C. Condenser Optics

Partial coherence in the illumination affects the image quality. For the small design features sought by an EUVL system, it is important that the condenser provide uniform, partial coherence illumination properties along the ringfield. As such, the present invention can be used with the condenser for a LPS disclosed and claimed in U.S. Pat. No. 5,361,292 or with the condenser for a synchrotron source disclosed and claimed in U.S. patent application Ser. No. 08/469,590, both invented by the inventor of the present invention. The condensers disclosed and claimed therein effectively and efficiently couple the source radiation to the arcuate slit of the ringfield of the camera. More specifically, the condensers disclosed therein translate the source radiation into beams that have an arcuate cross-section, which are superimposed onto each other to effectively illuminate the arcuate slit formed by the camera.

In an incoherently illuminated optical system, small features are attenuated due to the fall-off of the modulation transfer function ("MTF"). Partial coherence can be introduced into the illumination to counter this attenuation. This is normally accomplished by underfilling the entrance pupil in a system with Köhler illumination. In other words, the source is imaged into the entrance pupil of the camera, and this image is smaller than the pupil by a partial coherence factor of $\sigma \approx 0.6$. This value of $\sigma$ is a reasonable compromise, which amplifies the smaller features and does not add too much "ringing" to the larger features. The partial coherence factor $\sigma$ could be, for example, in the range of $0.5 > \sigma > 0.65$.

Characteristically, a projection reduction camera operates with a divergence of 5 to 15 mrad. Shape and size of the imaging region, again the responsibility of the condenser, varies with the camera design. A condenser should be able to capture several watts of radiation in the pass band of a ringfield lithographic camera and deliver over a watt to the mask, which is enough power to expose resist-coated wafers at a rate of several square centimeters per second. A typical pass band of a ringfield lithographic camera may be 130±1.3 Å. This pass band is determined by present multi-layer mirror technology. A reflectivity of 60 to 65% results from use of 40 successive Mo—Si layer pairs. Soft x-ray is also favored for surface reflection off certain metal mirrors. Angles of incidence of 5° to 10° from grazing incidence may result in reflectivity of 80 to 90%.

Figure 3:
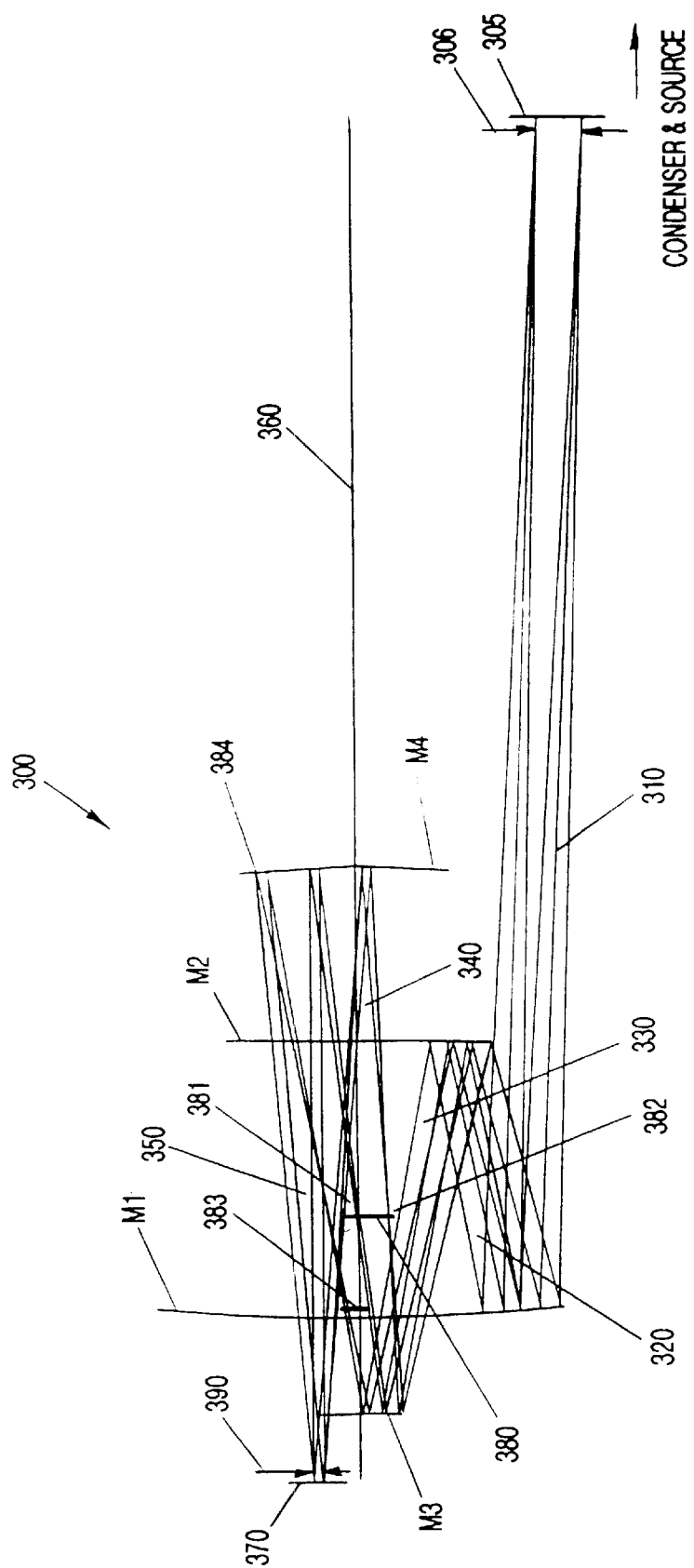
FIG. 3 is a schematic diagram of an EUV projection lithography camera using a lens system in accordance with the present invention.

As noted earlier, the cameras of the present invention are designed to operate with an efficient condenser system, such as the condensers disclosed and claimed by Sweatt, U.S. Pat. No. 5,361,292 and U.S. Ser. No. 08/469,590. When used with a LPS, the condenser of U.S. Pat. No. 5,361,292 delivers uniform intensity along the length of the ringfield. The five beam cross-sections are "bowtie-shaped" when they reach the camera's entrance pupil. They are fit together as shown in FIG. 3 of U.S. Pat. No. 5,361,292. This condenser provides Köhler-type illumination. The degree of partial coherence can be controlled by the pupil fill factor, which may be selected to be, for example, s=50%. Given all of these conditions and a plasma ball diameter of $D_{LPS}=0.2$ mm, the complete condenser/camera system can deliver about 0.55% of the in-band radiation to the wafer if the arcuate slit width at the wafer of the ringfield is 2.5 mm wide. This efficiency is nearly linear with slit width. Thus, prior art designs with a slit width of $\Delta r=1$ mm will deliver only about 0.22% to the wafer. Given a larger plasma ball diameter as in the new debris-less sources, e.g., D=0.3 mm, and a camera of the present invention of n.a.=0.1 mm and $\Delta r=2.5$ mm, the efficiency delivered to the wafer is about 0.37%. Similarly, with a camera of the present invention of n.a.=0.085 mm and $\Delta r=7$ mm, the efficiency is about 8.89% for a 0.3 mm source. Conversely, for the prior art cameras, e.g., Jewell et al., the efficiency would be about 0.07% for a 0.3 mm source.

In an efficient optical system, none of the photons collected are vignetted downstream in the system. This condition will be achieved if the etendue of the system does not decrease. Thus, the etendue of the camera must be greater than or equal to that of the condenser. This quantity is paraxially defined as (in the r-z plane) $E=Y_{bar}* U$, where E is the etendue, $Y_{bar}$ is the width of the ringfield at the wafer, and the convergence angle U of the ray bundle is equal to the numerical aperture, U=n.a. The efficiency of the system must be maximized, which means that the system's etendue must be maximized. The numerical aperture of the camera of the present invention is fixed, e.g., n.a.=0.10. Hence, to maximize the etendue, the slit width must be maximized.

Figure 2:
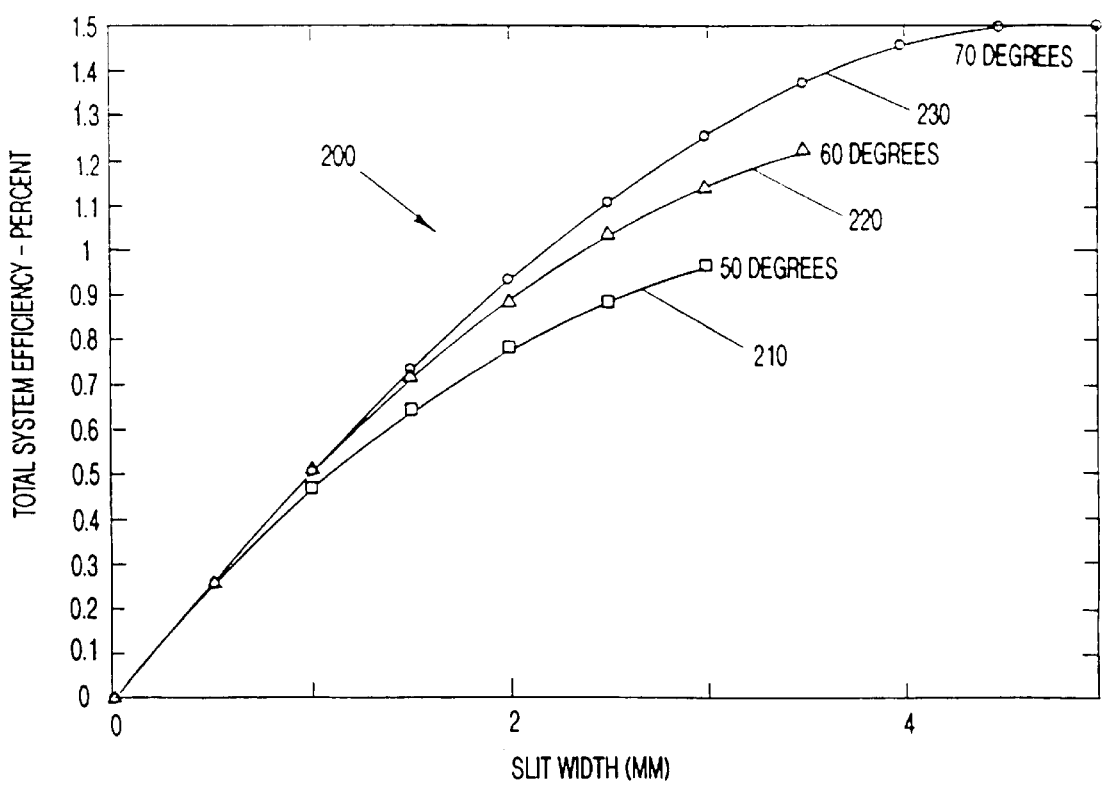
FIG. 2 is a graph of the flux at the wafer versus ringfield slit width for different collector angles, in accordance with Camera Design 1 of the present invention.

The new, ultra-low debris LPS (Kubiak et al., U.S. patent application Ser. No. 08/378,426) emits light into a hemisphere—it radiates into $4\pi$sr rather than radiating into $2\pi$ as in the metal surface LPS—and the condenser needs to collect a large fraction of it. Because of these large collection angles, the linear assumptions in the etendue calculations break down, though the trends do not. FIG. 2 illustrates the amount of light delivered to the wafer, i.e., the flux, as a function of slit width (in millimeters). Note that the efficiency curves 200 roll off for very large angles. The curves shown in FIG. 2 include the mirror reflectivities and all of the large collection angle effects, including the slit vignetting, the intensity fall-off with angle, the collector-mirror reflectivity, etc. The three curves shown, 210, 220, and 230, represent different maximum collection angles. Curve 210 represents collection angle=50°; curve 220 represents collection angle=60°; and curve 230 represents collection angle=70°.

D. The Invention

Referring to FIG. 3, from the object, or mask, plane to the image, or wafer, plane, the camera shown therein comprises EUV source (not shown) producing beam 310, in turn illuminating (transmissive or reflective) mask 305 over slit width 306 at the mask plane. The lens system 300 comprises a first concave aspheric mirror M1 (of radius R1), a first convex aspheric mirror M2 (of radius R2), a second convex aspheric mirror M3 (of radius R3), and a second concave aspheric mirror M4 (of radius R4) arranged such that the four mirrors, M1–M4, have a common axis of symmetry 360. The radially-symmetric parent mirrors, from which mirrors M1, M2, M3, and M4 could be cut, are shown centrally disposed about axis of symmetry 360. Ring-shaped object and image fields are also coaxial with reference to axis of symmetry 360 and their planes (i.e., the object/image planes containing the arcuate fields) are normal to axis of symmetry 360. FIG. 3 is a simplified schematic representation so that, for example, the EUV beam that emanates from the EUV source (not shown) is, typically, the consequence of a condenser (not shown) intermediate the EUV source and the mask. The respective mirrors are arranged so that beam 310, shown as diverging, is reflected by concave mirror M1 so as to illuminate convex mirror M2 with now converging beam 320. Reflection from convex mirror M2 results in beam 330, illuminating convex mirror M3, which in the instance shown, is also convex to result in illumination of concave mirror M4 by now diverging beam 340. Curvature and location of mirror M4 is such as to result in reflected radiation which is telecentric in image space. Illumination of wafer 370 by beam 350 is shown converging so as to represent such image reduction relative to the mask as provided for by the lens system 300 of the camera. The radiation from the mask is focused by the lens system 300 to form a reduced image on wafer 370, over ringfield width 390 at the wafer plane, by reflection from mirrors M1, M2, M3, and M4.

All of the optical elements are mounted in their respective positions by conventional structure (not shown). Note that in practice all four mirrors, M1, M2, M3 and M4, would have to be trimmed accordingly to allow the beams 320, 330, 340, and 350 to pass unobstructed through the lens system 300.

Some of the disadvantages of the Bruning et al. designs (U.S. Pat. Nos. 5,220,590 and 5,353,322) include an aperture stop that is largely inaccessible (only the bottom is accessible) causing the image quality to vary across the field. The present invention overcomes this disadvantage by increasing the radius of the ringfield so that an aperture stop 380 could be inserted. As illustrated in FIG. 3, however, the prime aperture stop 380 is not totally accessible. Only the top 381 of the prime aperture stop is deeply buried in the beam 350 headed toward the wafer 370; the bottom of beam 340 is accessible while its sides are mostly accessible. The prime aperture stop 380 limits only the bottom and sides of the beam bundle 340 to various field points. Other apertures 383 and 384 are needed to define the top of the beam bundles 340 and 350. Consequently, the top 381 of the prime aperture stop is "synthesized" with a couple of apertures; one partial aperture stop 383 is located just upstream of the prime aperture stop 380 and the other partial aperture stop 384 is located on mirror M4. Therefore, to achieve both a good image quality and a nearly telecentric image, the present invention synthesizes the prime aperture stop 380 with three partial aperture stops 382, 383, and 384; the three partial aperture stops 382, 383, and 384 are located in three different planes.

Although wider ringfields are better from an efficiency perspective, in terms of image quality, there are two contrast-reducing effects that must be considered as the field width is increased. The obvious difficulty is to maintain a diffraction-limited point spread function (a.k.a., a high Strehl ratio or a low root-mean-square wavefront error) over the wider field. A more subtle image degradation effect results from the distortion. Radial distortion in the ringfield moves the image around on the wafer during the scanning and "smears" it, which, when integrated over the slit width, also reduces the contrast.

Five different exemplary preferred embodiments are presented hereinafter. Generally, the discussion following under heading "Camera Design 1" is applicable to all of the designs presented herein except for the specific values presented in the tables. The lens system of the present invention is characterized by an optimized radius value for each of the four aspheric mirrors, an optimized distance value between each of the four aspheric mirrors, an optimized distance value between the mask and the first aspheric mirror M1, and an optimized distance value between said fourth aspheric mirror M4 and the wafer for defining the width of the arcuate slit. The present invention has a wide ringfield at the wafer in the range of 1.5 mm $\leq \Delta r_{wafer} <$ 8 mm using a large area radiation source of 0.1 mm diameter or larger, typically 0.3 mm to 0.5 mm.

The tables contain constructional data and other relevant information for the following five, exemplary preferred embodiments. The information is presented in a form appropriate for use with known and widely-available lens design software (exemplarily Zemax$_{TM}$: Optical Design Program by Focus Software, Inc., or OSLO® by Sinclair Optics, Inc.) as will be recognized by those of ordinary skill in the art. In principle, the optimization of the optical system could be performed analytically instead. Because the analytical approach is very tedious and time consuming, however, it is significantly less practical than the lens design software approach.

1. Camera Design 1

Generally, the design approach of the present invention began with optimizing a four-mirror camera comprised of spherical surfaces. The camera was then re-optimized with even aspherical mirrors. Referring to FIG. 3, the prime aperture stop 380 is partially accessible, and the curvatures and spacings (distances) of all four mirrors, M1–M4, vary so as to minimize the Seidel third and fifth-order aberrations. The low-order Seidel aberrations were minimized while the mirrors were forced to not interfere with the beams that needed to continue on to another target, which resulted in only modest aspheric departures allowing extremely accurate measurement. The image quality of the design was then optimized using conventional techniques well known to those of ordinary skill in the art. One resulting design is summarized below in Table I-A (and others in Tables II through V).

TABLE I-A

Lens Data Summary

| Reference | Type | Radius (mm) | Distance (mm) | Aperture Radius (min) |
|---|---|---|---|---|
| Mask Plane | Standard | Infinity | 900.00000 | 163.75460 |
| Mirror M1 | Spherical | 1372.48163 | −197.26899 | 138.84618 |
| Mirror M2 | Spherical | 26152.00000 | 269.91064 | 93.47339 |
| Mirror M3 | Spherical | −385.54803 | −405.38079 | 33.32211 |
| Mirror M4 | Spherical | −521.78088 | 455.38079 | 78.02328 |
| Wafer Plane | Standard | Infinity | 0 | 37.29838 |

Note from Tables I-B and I-C that the aberrations are quite small except for the third-order coma and distortion, which are modest. In this part of the design, the sum of the third and fifth order Petzval terms were minimized together so as to null the curvature and change of curvature of the image field at the center of the ringfield. The 3d and 5th distortion terms were similarly minimized as can be seen from Tables I-B and I-C.

TABLE I-B

Sum of Third-Order Seidel Aberrations (mm)

| Spherical | Coma | Astigmatism | Petzval | Distortion |
|---|---|---|---|---|
| 0.00422 | 0.33006 | −0.06736 | 0.00701 | −0.36355 |

TABLE I-C

Sum of Fifth-Order Seidel Aberrations (mm)

| Spherical | Coma | Astigmatism | Petzval | Distortion |
|---|---|---|---|---|
| 6.9559 e-05 | −0.00275 | 0.00103 | −0.00541 | 0.00055 |

Only a small amount of aspheric departure needed to be added to the mirrors, M1–M4, to reduce the system aberration to an acceptable level. The reason this is important is that it allows the mirrors to be tested at the center of curvature since the asphericity is minimal. Thus, fringes will be widely spaced in each interferogram so the phase front of the mirror can be accurately determined.

The even aspheric coefficients of the present invention, plus the curvatures and the spacings, were all permitted to vary in the design. This allowed the wavefront error and the real distortion (rather than just 3d and 5th order distortion) to be further minimized.

The exemplary preferred embodiment presented in Camera Design 1 has a numerical aperture of n.a.=0.10 mm at the wafer plane. The camera images a 50° segment of the $r_{mask}$=150 mm ringfield at the mask onto the wafer. The radius at the wafer is $r_{wafer}$=30 mm, the chord length is $l_{chord}$=25 mm, and the width of the ringfield is in the range 2 mm $\leq \Delta r_{wafer} \leq$ 2.6 mm at an EUV radiation of $\lambda$=14 nm. In order to create a 25×25 mm microchip, the mask and wafer are scanned together in a direction perpendicular to the chord length.

Figure 4:
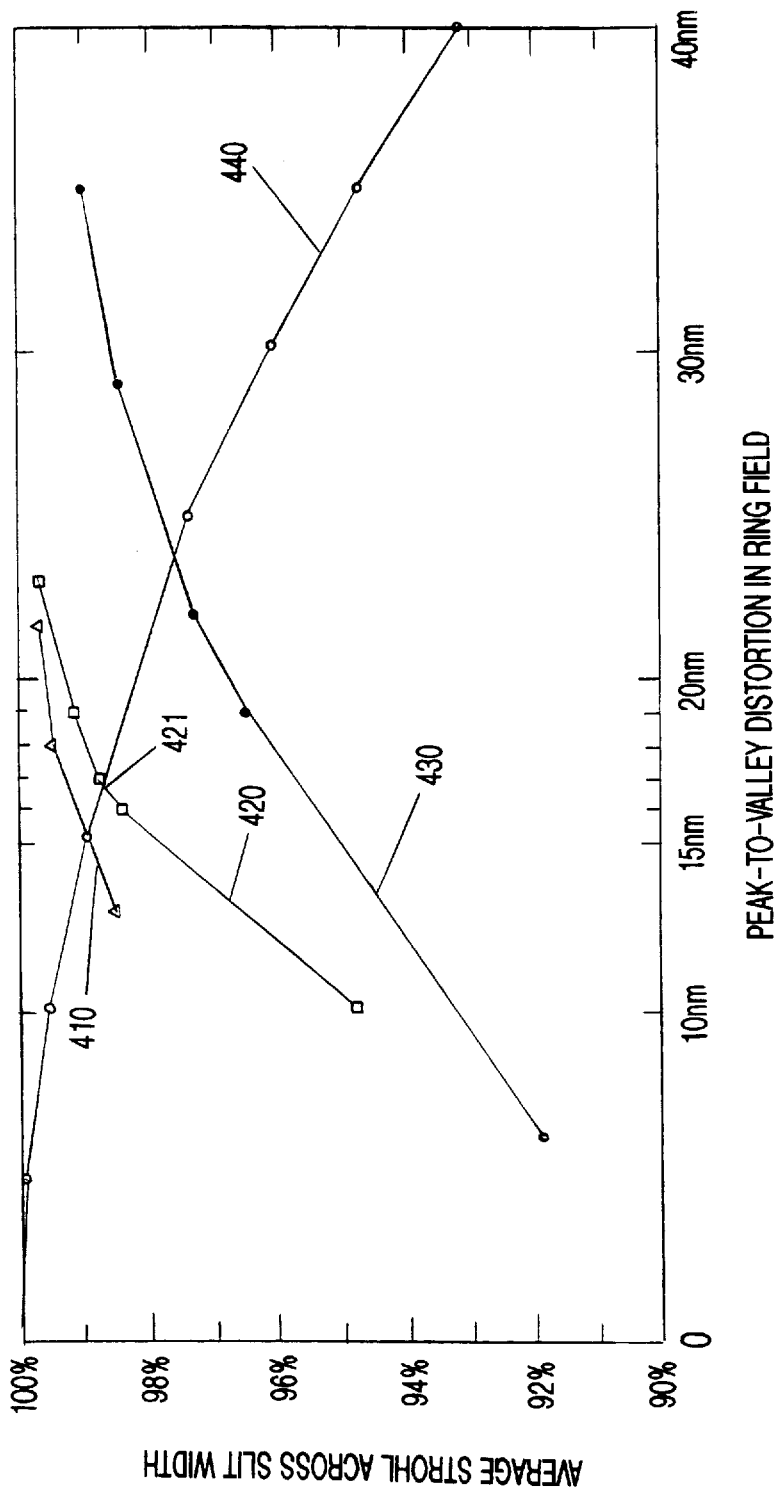
FIG. 4 is a graph of the reduction of contrast effects due to image smearing resulting from design distortion in the ringfield, regardless of slit width, in accordance with the present invention.

FIG. 4 illustrates the reduction of contrast due to smearing versus the peak-to-peak distortion in the ringfield, regardless of slit width. The average Strehl ratio in the ringfield for several camera designs are included in the graph of FIG. 4. Line 410 represents the contrast reduction for a 1.75 mm slit width; line 420 represents the contrast reduction for a 2.0 mm slit width; line 430 represents the contrast reduction for a 2.6 mm slit width; and line 440 represents the loss in contrast due to scan distortion. Note that for any given slit width, designs with less distortion have more aberration, which is not a surprising result. Another non-surprising result is that the image quality is better for narrower slits.

Referring to FIG. 4, along each line representing a given slit width, one skilled in the art would be able to choose a camera design with the maximum product of Strehl ratio and distortion-degraded contrast. For example, on the 2 mm slit width line 420, the 17 nm-peak-distortion case, represented by point 421, has a Strehl ratio, S>>98.5%, and a relative contrast of $C_{distortion}$>>98.5%, resulting in a product of about $C_{total}$>>97%. It is noted that the relative contrast, $C_{total}$, is not the best available estimate of image quality. The Strehl ratio is a measure of image quality for incoherently illuminated optical systems. In a partially-coherent system as presented herein, it is too stringent. Nonetheless, it is a reasonable and conservative first approximation.

A wider slit provides a more uniform scan to print the microchip features and minimizes distortion, especially when using a pulsed light source. To select the optimum slit width, one skilled in the art could, for example, determine the maximum allowable reduction in the relative contrast, $C_{total}$, based on photoresist parameters, line width control requirements, etc. From this number, the maximum allowable slit width could be inferred from FIG. 4.

Figure 5:
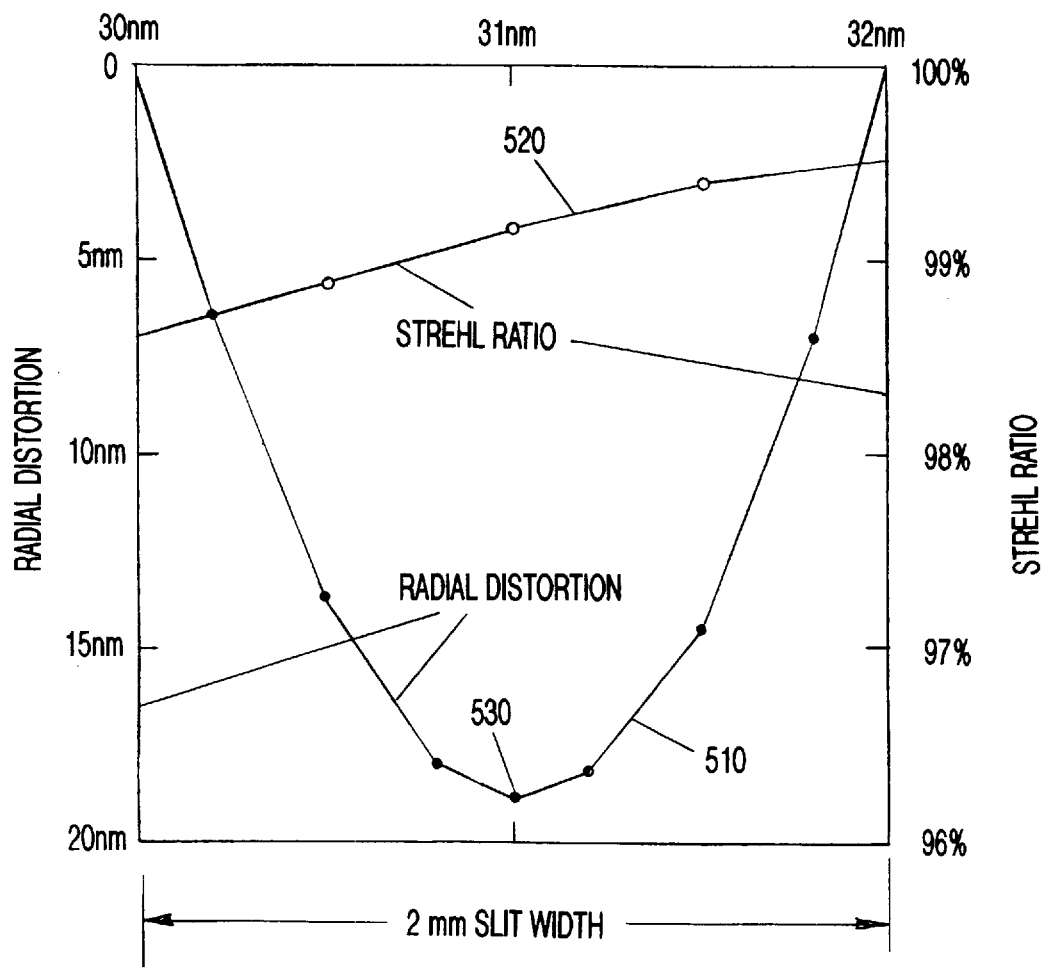
FIG. 5 is a graph of a the Strehl ratio and a typical distortion function for a 2 mm ringfield width in accordance with the present invention.

A typical distortion function 510 across a slit width of 2 mm is illustrated in FIG. 5. The Strehl ratio for the same camera with slit width of 2 mm is also plotted and shown in FIG. 5. It is interesting to note that in the different embodiments studied by the present inventor, when the distortion was minimized across the ringfield, it consistently took on a parabolic form with zero slope at the center of the ringfield 530 (or very close to it). As can be seen from the distortion function 510, the distortion was parabolic and symmetric across the ringfield width. The contrast reduction due to smearing that is plotted in FIG. 4 was generated assuming such a parabolic and symmetrical function.

Figure 6:
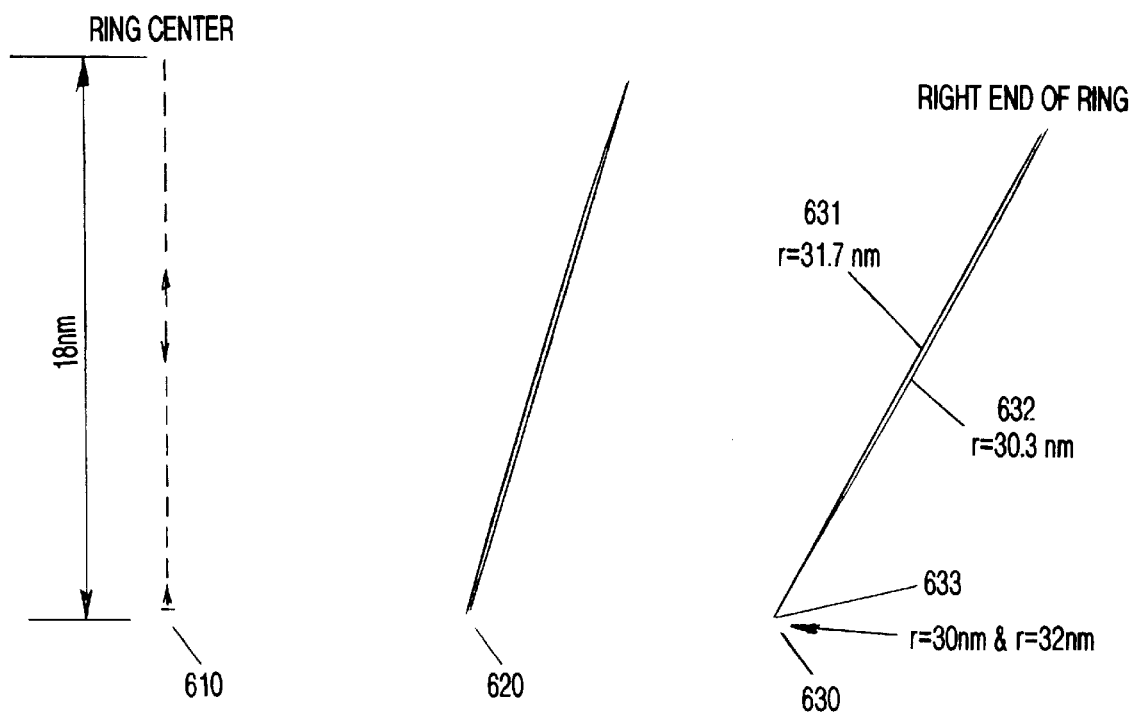
FIG. 6 is graphical representation of the image motion on the wafer, due to distortion in the camera, at the ends of the camera slit for a 2 mm slit width and peak-valley distortion of about 18 nm.

FIG. 6 is a graphical representation of the image motion on the wafer, due to distortion in the camera, from the center to one end of a 2 mm-wide camera slit and peak-valley distortion of about 18 nm. The image motion due to distortion in the camera has to be in the radial direction because the optical system is radially symmetric. However, the scanning is not a radial function. To determine the image motion on the wafer at the ends of the slit, a camera with a ringfield width of 2 mm-wide slit (corresponding to line 420 of FIG. 4 with 18 nm of distortion) was studied and three areas along its radius were plotted in FIG. 6. In the object plane, three separate image positions 610, 620, and 630, respectively, were marched across the slit in the scan direction. The motion of their image positions were plotted in FIG. 6. One of the positions 610 was at the center of the slit, θ=0°, a second position 630 was at one end of the slit, θ=30°, and a third position 620 was about half-way between 0° and 30°. Note that the motion of all three lines, 610, 620, and 630, was nearly radial with only a small circumferential component. Referring to position 630, point 631 represents r=31.7 mm, point 632 represents r=30.3 mm, and point 633 represents r=30 and 32 mm. These results appear to justify using FIG. 4 to describe the smearing along the whole length of the arc image.

Figure 7:
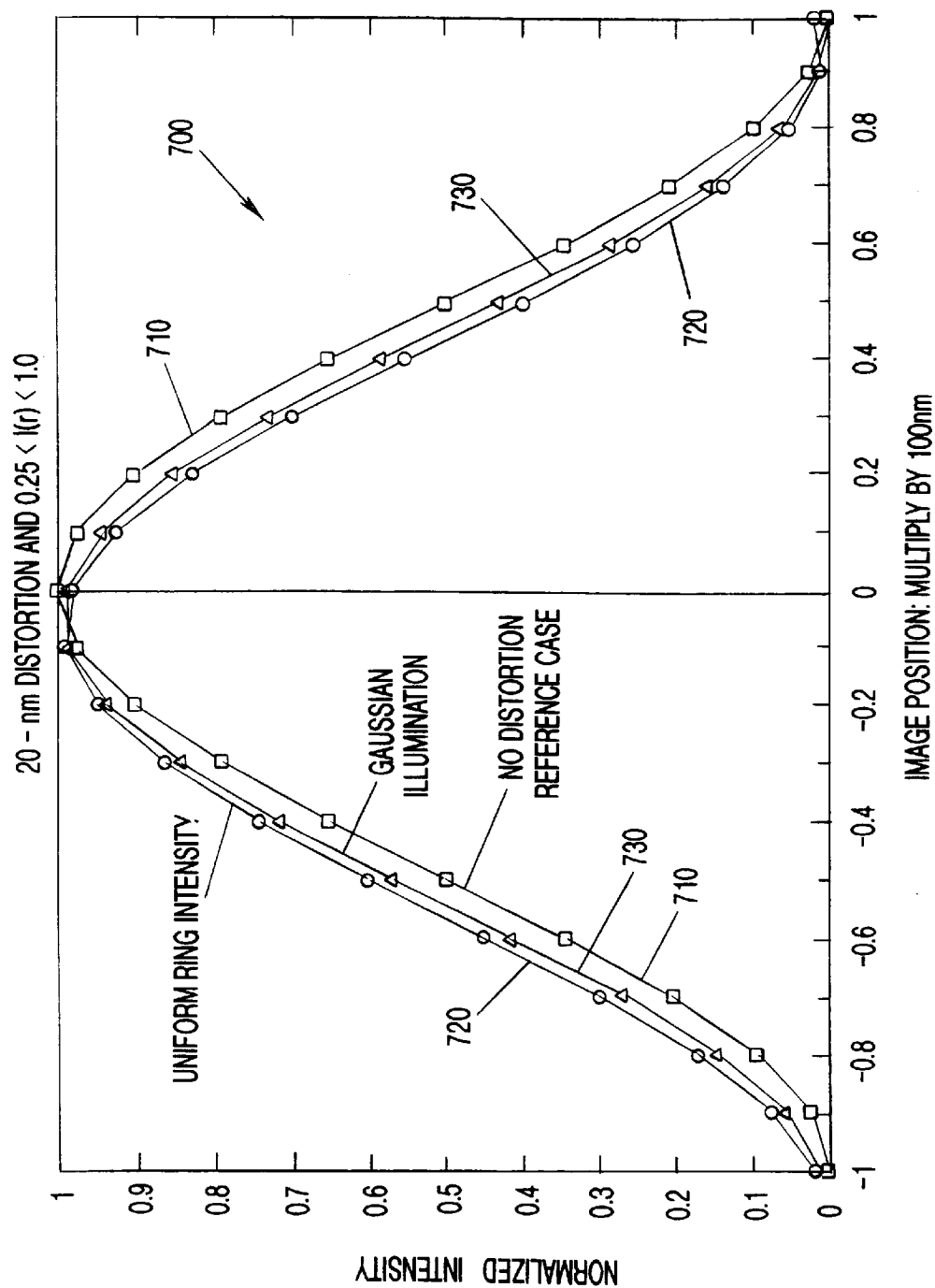
FIG. 7 is a graph of three image intensity curves illustrating the effects of distortion with uniform Gaussian illumination.

Referring to FIG. 4 again, the contrast reduction curve was calculated assuming that the illumination intensity is uniform across the slit. This is a worst-case assumption; the intensity should be greatest in the center (radial direction) of the slit and less near the slit's edges where the distortion is the worst. Referring to FIG. 7, consider the three image intensity curves 700 shown. The sinusoid curve 710, which is unshifted, is an undistorted image—uniform ring intensity—of one line and one space in a bar target composed of many 100 nm features. The sinusoid curve 720, which is shifted the furthest, represents a camera with 20 nm of distortion (peak-valley) and a uniformly-illuminated slit. The middle sinusoid curve 730 represents 20 nm of distortion and a Gaussian illumination profile that drops to 25% intensity at the edges of the slit. This last case has 70 to 80% of the reduction in contrast as seen in the uniform illumination case. It is contemplated that the system of the present invention would fall about half-way between these cases.

FIGS. 8a–c illustrate the cross-sections of the aperture stop 380 and the two partial aperture stops 383 and 384 (references correspond to FIG. 3). FIG. 8a illustrates the shape of the partial aperture stop 880 (corresponding to partial aperture stop 380 in FIG. 3). The optical axis of symmetry is located at point 885 (in FIGS. 8*a–c*), which is also the center of beam bundle 840 (corresponding to beam 340 in FIG. 3). FIG. 8*a* also illustrates the position of beam bundle 850 (corresponding to beam 350 of FIG. 3) between mirror M4 and the wafer as it passes through this plane after reflecting off of mirror M4. Note that the partial aperture stop 880 (corresponding to partial aperture stop 380 in FIG. 3) clips the beam bundle 850 (corresponding to beam 350 in FIG. 3) headed for the end of the slit 890 as indicated by the shaded area 845.

Referring to FIG. 8*b*, the partial aperture stop 884 (corresponding to stop 384 in FIG. 3) on mirror M4 clips the beam bundle 840 (corresponding to beam 340 in FIG. 3) headed for the center of the slit 890 in the manner shown by the shaded area 855. The shaded area 875 in the beam bundle 840 (corresponding to beam 340 in FIG. 3) amounts to 2% of the area of the aperture and corresponds to the horns 881 in FIG. 8*a*. The reduction in intensity will be far less than 2% because of the partially coherent illumination (recall that the aperture fill factor is exemplarily s=50% so most of the beam power is in the center of the aperture). The partial aperture stop 884 (corresponding to partial aperture stop 384 in FIG. 3) on mirror M4 is shown comprised of two circles 860 and 865, respectively, which truncate some of the area of the central beam bundle 840 (corresponding to beam 340 in FIG. 3) and adds about an equal amount.

FIG. 8*c* illustrates the shape of the partial aperture stop 883 (corresponding to 383 in FIG. 3) at a distance of 80 mm from mirror M3. The partial aperture stop 883 is shown comprised of three circles 841, 842, and 843, respectively, which truncate some of the area of the beam bundle 840 as it is reflected off of mirror M3. The beam bundle 840 passes through partial aperture stop 883, while beam bundle 850 (corresponding to beam 350 in FIG. 3) passes over partial aperture stop 883 as shown. Slit 890 can be seen through the center of partial aperture stop 883.

Due to the finite width of the slit, there will be a slight change in aperture shape. This is an effect that should integrate out because of the scanning. The slit width could introduce a very small deviation from the telecentric condition. However, the instantaneous error could never be greater than 0.004 radians, and the integrated error will approach zero. If the camera were about 1 μm out of focus, it would introduce a peak error in pattern location of about 4 nm. This much image smearing could reduce the contrast by 0.025%, or 1/4000.

2. Camera Design 2

The preferred embodiment presented in Camera Design 2 has a numerical aperture of n.a.=0.10 mm at the wafer plane. It has a 2.0 mm-wide ringfield at an EUV source radiation of λ=14 nm.

TABLE II-A

Lens Data Summary

| Reference | Type | Radius (mm) | Distance (mm) | Aperture Radius (mm) |
|---|---|---|---|---|
| Mask Plane | Standard | Infinity | 892.51141 | 160.00000 |
| Mirror M1 | Even Aspheric | 1372.10112 | −204.91448 | 139.83851 |
| Mirror M2 | Even Aspheric | 25649.00000 | 275.72702 | 93.45210 |
| Mirror M3 | Even Aspheric | −386.49655 | −405.38080 | 33.04511 |
| Mirror M4 | Even Aspheric | −521.78090 | 455.38080 | 77.52351 |
| Wafer Plane | Standard | Infinity | 0 | 36.99840 |

The deviation of each mirror surface from a sphere, the wavefront error, is described by the expression, $W(r) = ADr^4 + AEr^6 + AFr^8 + AGr^{10}$, where $r^n$ are orders of aberration, and AD, AE, AF, and AG are coefficients. The following table lists the coefficients for the embodiment of Camera Design 2.

TABLE II-B

Aspheric Coefficients Data

| Surface | Type | r4 Coeff (AD) | r6 Coeff (AE) | r8 Coeff (AF) | r10 Coeff (AG) |
|---|---|---|---|---|---|
| Mirror M1 | Even Aspheric | 4.7349 e-11 | 1.5779 e-16 | −4.3699 e-21 | 6.4418 e-26 |
| Mirror M2 | Even Aspheric | 8.1042 e-12 | −1.2909 e-15 | 5.8750 e-20 | −9.9111 e-25 |
| Mirror M3 | Even Aspheric | −8.2061 e-09 | 1.7742 e-13 | 1.1298 e-17 | 0 |
| Mirror M4 | Even Aspheric | −1.0486 e-10 | −5.8904 e-16 | 3.7953 e-21 | 0 |

Coefficients on r12, r14, and r16 are zero for Mirrors M1–M4.

TABLE II-C

Image Quality Data at Wafer Plane

| Radius (mm) | Strehl Ratio | Distortion (nm) |
|---|---|---|
| 32.00 | 99.6% | 19.1 |
| 31.50 | 99.5% | 4.5 |
| 31.00 | 99.2% | 0.0 |
| 30.50 | 99.0% | 4.8 |
| 30.00 | 98.6% | 18.1 |

Average Strehl Ratio, $S_{average}$ = 99.2%

3. Camera Design 3

The preferred embodiment presented in Camera Design 3 has a numerical aperture of n.a.=0.10 mm at the wafer plane. It has a 2.6 mm-wide ringfield at an EUV source radiation of λ=14 nm.

TABLE III-A

Lens Data Summary

| Reference | Type | Radius (mm) | Distance (mm) | Aperture Radius (mm) |
|---|---|---|---|---|
| Mask Plane | Standard | Infinity | 892.55498 | 162.48660 |
| Mirror M1 | Even Aspheric | 1369.43678 | −205.01032 | 141.83738 |
| Mirror M2 | Even Aspheric | 23863.00000 | 275.74878 | 94.63056 |
| Mirror M3 | Even Aspheric | −386.71550 | −405.38080 | 33.32211 |
| Mirror M4 | Even Aspheric | −521.78090 | 455.38080 | 78.02328 |
| Wafer Plane | Standard | Infinity | 0 | 37.49838 |

TABLE III-B

Aspheric Coefficients Data

| Surface | Type | r4 Coeff (AD) | r6 Coeff (AE) | r8 Coeff (AF) | r10 Coeff (AG) |
|---|---|---|---|---|---|
| Mirror M1 | Even Aspheric | 5.1662 e-11 | 1.0687 e-16 | −9.0640 e-21 | 1.7143 e-25 |
| Mirror M2 | Even Aspheric | 2.3473 e-11 | −2.2376 e-15 | 2.8488 e-20 | 1.6903 e-24 |
| Mirror M3 | Even Aspheric | −8.1292 e-09 | −3.3199 e-13 | 1.4574 e-16 | −4.6711 e-20 |
| Mirror M4 | Even Aspheric | −1.0401 e-10 | −9.6063 e-16 | 7.4783 e-20 | −5.1145 e-24 |

Coefficients on r12, r14, and r16 are zero for Mirrors M1–M4.

TABLE III-C

Image Quality Data at Wafer Plane

| Radius (mm) | Strehl Ratio | Distortion (nm) |
|---|---|---|
| 32.50 | 98.7% | 24.6 |
| 31.35 | 98.3% | 5.3 |
| 30.55 | 96.8% | 6.7 |
| 31.20 | 97.6% | 0.0 |
| 29.90 | 95.9% | 23.7 |

Average Strehl Ratio, $S_{average}$ = 97.5%

4. Camera Design 4

The preferred embodiment presented in Camera Design 4 has a numerical aperture of n.a.=0.08 mm at the wafer plane, which results in good imagery when printing 130 nm features, and moreover, results in feature sizes as small as 100 nm. It has a wide ringfield with Δr=7 mm at the wafer plane. Thus, the camera's etendue is large enough to allow a condenser to collect about 25% of the EUV radiated into a hemisphere from a 0.5 mm diameter ultra-low debris LPS. Hence, Camera Design 4 can be part of an efficient system, even when used with a state-of-the-art ultra-low debris LPS. The Strehl ratio for Camera Design 4 is >97%.

As stated earlier with reference to FIG. 3, the prime aperture stop 380 is not totally accessible. For this embodiment, the top of the beam 340 can be reached about 4 cm to the left of the prime aperture stop 380 position at partial aperture stop 383. An aperture stop 383 at this 4 cm point allows the marginal ray angle for the top of the beam 340 to vary through the range $\theta_{top}$=0.08±0.0022, which is a variation of ±2.7%. Because the camera of the present invention would be used in a scanning mode, this minor variation should not noticeably affect the imagery.

The system parameters for Camera Design 4 are listed in Tables IV-A through IV-D. Note that the mirror numbers, M1, M2, M3, and M4, listed in Table IV-A through IV-D correspond to those illustrated in FIG. 3.

TABLE IV-A

Lens Data Summary

| Reference | Type | Radius (mm) | Distance (mm) | Aperture Radius (mm) |
|---|---|---|---|---|
| Mask Plane | Standard | Infinity | 892.55498 | 175.02289 |
| Mirror M1 | Even Aspheric | 1364.17153 | −205.01032 | 148.09073 |
| Mirror M2 | Even Aspheric | 21003.00000 | 275.74878 | 97.39582 |
| Mirror M3 | Even Aspheric | −387.13004 | −405.38080 | 31.76612 |
| Mirror M4 | Even Aspheric | −521.78090 | 455.38080 | 71.77883 |
| Wafer Plane | Standard | Infinity | 0 | 35.00000 |

TABLE IV-B

Aspheric Coefficients Data

| Surface | Type | r4 Coeff (AD) | r6 Coeff (AE) | r8 Coeff (AF) | r10 Coeff (AG) |
|---|---|---|---|---|---|
| Mirror M1 | Even Aspheric | 8.1069 e-11 | −1.3359 e-15 | 2.8081 e-20 | −2.7194 e-25 |
| Mirror M2 | Even Aspheric | 1.0457 e-10 | −1.1621 e-14 | 5.8336 e-19 | −1.3643 e-23 |
| Mirror M3 | Even Aspheric | −7.9730 e-09 | −5.7211 e-13 | 3.3260 e-16 | −1.1216 e-19 |
| Mirror M4 | Even Aspheric | −1.0437 e-10 | −8.0181 e-16 | 1.1665 e-20 | 1.4530 e-24 |

Coefficients on r12, r14, and r16 are zero for Mirrors M1–M4.

Table IV-C contains image quality data at the wafer plane. Note that the total range of design distortion is about 14 nm in image space which may be smaller than necessary for some objectives—probably by a factor of two. The theoretical Strehl ratio averages almost 98%, which is adequate for a production machine.

TABLE IV-C

Image Quality Data at Wafer Plane

| Radius (mm) | Strehl Ratio | Distortion (nm) |
|---|---|---|
| 35.00 | 98.5% | 1 |
| 33.25 | 98.6% | −11 |

TABLE IV-C-continued

Image Quality Data at Wafer Plane

| Radius (mm) | Strehl Ratio | Distortion (nm) |
|---|---|---|
| 31.50 | 97.3% | −3 |
| 30.25 | 97.2% | 3 |
| 28.00 | 97.0% | −3 |
| Average Strehl Ratio, $S_{average}$ = 98% | | |

The asphericities of the mirrors should be reasonable for manufacture. Mirrors M1 and M3 (see Table IV-D) have aspheric departures from best-fit spheres of 2.5 $\mu$m and 2.2 $\mu$m across the aperture shown in FIG. 3. Therefore, there would be seven and eight fringes in the interferograms of mirrors M1 and M3, which would allow these interferograms to be read with adequate accuracy. The other two mirrors M2 and M4 have 0.5 and 0.1 microns of departure which implies 1.5 and 0.3 fringes, respectively.

As can be seen from Table IV-D, mirror M1 is the largest of the four mirrors, having a 150 mm-radius clear aperture. Mirror M2 has a 110 mm-radius clear aperture, and the other two, M3 and M4, have 32 mm and 72 mm-radii clear apertures, respectively.

TABLE IV-D

Mirror Sizes and Aspheric Departures

| Mirror | Clear Apertures | | Aspheric Departure ($\mu$m) |
|---|---|---|---|
| | Outer (mm) | Inner (mm) | |
| M1 | 150 | 94 | 2.5 |
| M2 | 110 | 56 | 0.5 |
| M3 | 32 | 3 | 2.2 |
| M4 | 72 | 0 | 0.1 |

It is contemplated that Camera Design 4 could be re-optimized slightly—allowing the distortion to degrade in exchange for improvement of the Strehl ratio. One more degree of freedom could be introduced to improve the image quality. The conic constant has not been allowed to vary, which would give a little control over the twelfth-order aspheric. This is not particularly easy because the conic constant also introduces fourth, sixth, eighth, and tenth-order aspheric departures as well.

It is also contemplated that the ringfield width of Camera Design 4 cannot be enlarged because of the potential interference on the outside of mirror M2. In fact, the ringfield width may need to be reduced slightly to allow more clearance on M2, which may also improve the image quality. The remaining aspects of the designs presented herein seem to be near to the optimum for the 5×magnification.

5. Camera Design 5

The preferred embodiment presented in Camera Design 5 has a numerical aperture of n.a.=0.085 mm at the wafer plane. It has a wide ringfield with $\Delta r$=7 mm at the wafer plane. Regarding element volume data, the units are cubic cm. FIG. 9 illustrates the Camera Design 5, which may be the most efficient system available from this family of designs. Note that the beams 920, 930, 940, and 950 have larger angles between them in comparison to the embodiment shown in FIG. 3.

Referring to FIG. 9, from the object, or mask, plane to the image, or wafer, plane, the camera shown therein comprises EUV source (not shown) producing beam 910, in turn illuminating (transmissive or reflective) mask 905. The lens system 900 comprises a first concave aspheric mirror M1 (of radius R1), a first convex aspheric mirror M2 (of radius R2), a second convex aspheric mirror M3 (of radius R3), and a second concave aspheric mirror M4 (of radius R4) arranged such that the four mirrors, M1–M4, have a common axis of symmetry. The respective mirrors are arranged so that beam 910, shown as diverging, is reflected by concave mirror M1 so as to illuminate convex mirror M2 with now converging beam 920. Reflection from convex mirror M2 results in beam 930, illuminating convex mirror M3, which in the instance shown, is convex to result in illumination of concave mirror M4 by now diverging beam 940. Curvature and location of mirror M4 is such as to result in reflected radiation which is telecentric in image space. Illumination of wafer 970 by beam 950 is shown converging so as to represent such image reduction relative to the mask as provided for by the lens system 900 of the camera. The radiation from the mask is focused by the lens system 900 to form a reduced image on wafer 970, over ringfield width 990 at the wafer plane, by reflection from mirrors M1, M2, M3, and M4.

As illustrated in FIG. 9, the prime aperture stop 980 is not totally accessible. The bottom of the prime aperture stop 980 is buried in the beam 950 headed toward the wafer 970; the top of beam 940 is accessible while its sides are mostly accessible. The prime aperture stop 980 limits only the top and sides of the beam bundle 950 to various field points.

Other apertures 983 and 984 are needed to define the bottom of beam bundle 940. Consequently, the bottom of the prime aperture stop 980 is "synthesized" with a couple of apertures; one partial aperture stop 984 is located on Mirror M4 as shown and the other partial aperture stop 983 is located upstream of the aperture stop 980 as shown in FIG. 9. The prime aperture stop is synthesized with three partial aperture stops 980, 983, and 984; the three partial aperture stops 980, 983, and 984 are located in three different planes.

General Lens Data

Eff. Focal Length: 808.515

Image Space F/#: 5.88139

Primary Wave: 0.013400

TABLE V-A

Lens Data Summary

| Reference | Type | Radius (mm) | Distance (mm) | Aperture Radius (mm) |
|---|---|---|---|---|
| Mask Plane | Standard | Infinity | 4936.0530 | 350.00000 |
| Partial Stop | Standard | Infinity | −4936.0530 | 137.47000 |
| Mirror M1 | Even Aspheric | 1355.4290 | −214.8231 | 311.97120 |
| Mirror M2 | Even Aspheric | 15648.0000 | 275.7488 | 205.14130 |
| Mirror M3 | Even Aspheric | −388.9355 | −405.3800 | 68.87009 |

TABLE V-A-continued

Lens Data Summary

| Reference | Type | Radius (mm) | Distance (mm) | Aperture Radius (mm) |
|---|---|---|---|---|
| Mirror M4 | Even Aspheric | −521.7809 | 455.3800 | 107.27920 |
| Wafer Plane | Standard | Infinity | 0 | 70.00007 |

TABLE V-B

Aspheric Coefficients Data

| Surface | Type | r4 Coeff (AD) | r6 Coeff (AE) | r8 Coeff (AF) | r10 Coeff (AG) | r12 Coeff (AH) |
|---|---|---|---|---|---|---|
| Mirror M1 | Even Aspheric | −6.573293 e-011 | 1.372166 e-015 | −5.280091 e-020 | 1.324229 e-024 | −1.427363 e-029 |
| Mirror M2 | Even Aspheric | −3.432741 e-011 | 6.857198 e-015 | −4.041393 e-019 | 2.096367 e-023 | −5.597392 e-028 |
| Mirror M3 | Even Aspheric | 8.12047 e-009 | 3.007218 e-013 | −1.453594 e-017 | −4.467772 e-020 | 2.026248 e-023 |
| Mirror M4 | Even Aspheric | 9.9642 e-011 | 4.21549 e-015 | −1.169804 e-018 | 1.860431 e-022 | −1.150032 e-026 |

Coefficients on r14 and r16 are zero for Mirrors M1–M4.

TABLE V-C

Image Quality Data At Wafer Plane

| Radius (mm) | Strehl Ratio | Distortion (nm) |
|---|---|---|
| 28.00 | 97.3% | −5 |
| 29.25 | 99.0% | 7 |
| 31.50 | 98.2% | 3 |
| 33.25 | 98.5% | −1 |
| 35.00 | 97.0% | −6 |

Average Strehl Ratio, $S_{average}$ = 98 %

As stated throughout the discussion of the present invention, the specific (optimized) values listed in Tables I through V could be varied. More specifically, the tolerance of the distances listed in the tables above between the mask and mirror M1 and between mirrors M1 and M2 could be varied by at least±20%. The tolerance of the radius of mirror M1 could be varied by at least±10% while the radius of mirror M2 could be varied by at least±30%. The tolerance of the radii of mirrors M3 and M4 could be varied by at least±10% as could the distances between mirrors M2 and M3, M3 and M4, and M4 and the wafer. The distance from the mask to mirror M1 could vary by at least±20%. It is understood that variations in the range of values listed above may allow corresponding changes in magnification (object:image) (e.g., 5:1) of the lens system presented, and other magnifications are contemplated. One of ordinary skill in the art may select design values within the ranges contemplated herein in accordance with a desired magnification.

As can be appreciated from the five exemplary embodiments presented, the aspheric coefficients vary significantly depending on the specific requirements, e.g., ringfield width or peak distortion. These can also be changed by selecting a conic constant other than zero.

Other variations and modifications of the present invention will be apparent to those of ordinary skill in the art, and it is the intent of the appended claims that such variations and modifications be covered. For example, the designs presented by the present invention could be scaled were that to be useful. The camera could be reduced to 80% of its present size. This would reduce the aberrations and distortion to 80% of the present values, which is good. The ringfield width, however, would also be reduced linearly, which would reduce the etendue. If the field width were re-opened, the distortion would increase quadratically which more than compensates the linear reduction. It is contemplated that when all of the errors are balanced off and the etendue is regained, there would be no significant gain or loss.

While specific values have been used and listed in the foregoing tables for the sake of completeness, they do not set limits on the inventive teaching, which is properly described in the claims. The particular values and configurations discussed above can be varied and are cited merely to illustrate particular embodiments of the present invention and are not intended to limit the scope of the present invention. It is contemplated that the use of the present invention may involve components having different characteristics as long as the principle, the presentation of a camera that allows greater condenser efficiency and more uniform illumination of the ringfield of the camera, is followed. It is intended that the scope of the present invention be defined by the claims appended hereto.

VI. REFERENCES CITED

The entire disclosures of all references—patents, patent applications, and publications—cited herein are hereby incorporated by reference. The following patents, patent applications, and publications have been cited herein:

1. Sweatt, Condenser for Illuminating a Ring Field, U.S. Pat. No. 5,361,292.
2. Bruning et al., Lens System for X-ray Projection Lithography Camera, U.S. Pat. No. 5,353,322.
3. Jewell et al., Ringfield Lithography, U.S. Pat. No. 5,315,629.
4. Bruning et al., X-ray Projection Lithography Camera, U.S. Pat. No. 5,220,590.
5. Hawryluk et al., Soft X-ray Reduction Camera for Submicron Lithography, U.S. Pat. No. 5,003,567.
6. Shafer et al., Optical Relay System with Magnification, U.S. Pat. No. 4,747,678.

7. Cook, Reflective Optical Triplet Having a Real Entrance Pupil, U.S. Pat. No. 4,733,955.
8. Wetherell et al., All-Reflective Three Element Objective, U.S. Pat. No. 4,240,707.
9. Offner, Unit Power Imaging Catoptric Anastigmat, U.S. Pat. No. 3,748,015.
10. Sweatt, Condenser for Illuminating A Ringfield Camera with Synchrotron Emission Light, U.S. patent application Ser. No. 08/469,590.
11. Kubiak et al., Cluster Beam Targets for Laser Plasma Extreme Ultraviolet and Soft X-ray Sources U.S. patent application Ser. No. 08/378,426.

I claim:

1. An optical system for a projection lithography camera for use with an extreme ultra-violet radiation source, a wafer, and a mask to be imaged on the wafer, comprising:

an optical axis of symmetry;

first, second, third, and fourth aspheric mirrors, each of said first aspheric mirror, said second aspheric mirror, said third aspheric mirror, and said fourth aspheric mirror being supported and substantially aligned about the optical axis of symmetry and cooperating with an arcuate slit of the camera, the arcuate slit having a center and being defined by a width W, and a chord length, L, and formed as a portion of a ringfield that is defined by a radial dimension, R, wherein R spans a distance from said optical axis of symmetry and the center of the arcuate slit;

said optical system being characterized by an optimized radius value for each of said first aspheric mirror, said second aspheric mirror, said third aspheric mirror, and said fourth aspheric mirror, an optimized distance value between each consecutive aspheric mirror, an optimized distance value between the mask and said first aspheric mirror, and an optimized distance value between said fourth aspheric mirror and the wafer for defining the width of the arcuate slit to be at least 1.5 mm;

said first aspheric mirror being disposed to receive radiation from the mask and reflect the radiation to said second aspheric mirror;

said second aspheric mirror being disposed to receive radiation from said first mirror and reflect the radiation to said third aspheric mirror;

said third aspheric mirror being disposed to receive radiation from said second mirror and reflect the radiation to said fourth aspheric mirror;

said fourth aspheric mirror being disposed to receive radiation from said third aspheric mirror and focus it at a reduced image area on the wafer relative to the mask; and synthetic aperture stop means for producing a telecentric image, said aperture stop means comprising at least two separate partial aperture stops being disposed to intercept the radiation traveling between the third mirror and the surface of the fourth mirror.

2. The system of claim 1, wherein said first aspheric mirror is defined to have a substantially concave curvature, said second aspheric mirror is defined to have a substantially convex curvature, said third aspheric mirror is defined to have a substantially convex curvature, and said fourth aspheric mirror is defined to have a substantially concave curvature.

3. The system of claim 1, wherein said plurality of partial aperture stops comprises: at least one partial aperture stop disposed on said fourth aspheric mirror for regulating the radiation that is reflected from said fourth aspheric mirror to the reduced image area on the wafer; and at least one partial aperture stop disposed between said third aspheric mirror and said fourth aspheric mirror for regulating the radiation that is reflected from said third aspheric mirror to said fourth aspheric mirror.

4. The system of claim 1, wherein the extreme ultra-violet radiation source has a diameter in the range of $0.2 \text{ mm} \leq D \leq 1 \text{ mm}$.

5. The system of claim 4, wherein the extreme ultra-violet radiation source has a diameter of substantially $D=0.4$ mm.

6. The system of claim 1, wherein said first aspheric mirror, said second aspheric mirror, said third aspheric mirror, and said fourth aspheric mirror are optimized to reflect radiation from the extreme ultra-violet radiation source in the wavelength range of $\lambda=50$ to $700$ Å.

7. The system of claim 1, wherein said first aspheric mirror, said second aspheric mirror, said third aspheric mirror, and said fourth aspheric mirror are optimized to reflect radiation from the extreme ultra-violet radiation source at a wavelength of $\lambda=134$ Å.

8. The system of claim 1, wherein said system has a slit width in the range of $1.5 \text{ mm} \geq W \geq 8.0 \text{ mm}$.

9. The system of claim 8, wherein said system has a numerical aperture of n.a.=0.10 mm.

10. The system of claim 8, wherein said system has a numerical aperture of n.a.=0.085 mm.

11. The system of claim 1, wherein said system has a slit width of W=7 mm and a numerical aperture of n.a.=0.085 mm.

12. The system of claim 1, wherein said system is optimized to resolve image feature sizes as small as 100 nm.

13. The system of claim 1, wherein said system is optimized to resolve image feature sizes as small as 125 nm.

14. The system of claim 1, wherein the system is telecentric in the image space of the camera.

15. The system of claim 1, wherein the system produces a Strehl ratio of at least 97% but less than or equal to 99%.

* * * * *